United States Patent
Strnad

(10) Patent No.: US 6,246,100 B1
(45) Date of Patent: Jun. 12, 2001

(54) THERMAL COUPLER UTILIZING PELTIER AND SEEBECK EFFECTS

(75) Inventor: Richard J. Strnad, Cupertino, CA (US)

(73) Assignee: National Semiconductor Corp., Santa Clara, CA (US)

(*) Notice: Subject to any disclaimer, the term of this patent is extended or adjusted under 35 U.S.C. 154(b) by 0 days.

(21) Appl. No.: 09/252,607

(22) Filed: Feb. 3, 1999

(51) Int. Cl.$^7$ .................................................. H01L 31/058
(52) U.S. Cl. ............................................ 257/467; 257/930
(58) Field of Search ........................................ 136/203, 204; 257/467, 468, 720, 930

(56) References Cited

U.S. PATENT DOCUMENTS

| | | | |
|---|---|---|---|
| 3,766,444 | 10/1973 | Bosch | 317/234 R |
| 4,058,779 | 11/1977 | Fraley | 331/108 R |
| 4,757,528 | 7/1988 | Falater et al. | 379/412 |
| 4,812,733 | 3/1989 | Tobey | 323/282 |
| 5,079,618 | 1/1992 | Farnworth | 357/81 |
| 5,166,777 | 11/1992 | Kataoka | 257/716 |
| 5,229,327 | 7/1993 | Farnworth | 437/209 |
| 5,241,828 | * 9/1993 | Kapitulnik | 62/3.2 |
| 5,267,252 | 11/1993 | Amano | 372/34 |
| 5,419,780 | 5/1995 | Suski | 136/205 |
| 5,430,322 | 7/1995 | Koyanagi | 257/467 |
| 5,457,342 | 10/1995 | Herbst | 257/712 |
| 5,477,076 | * 12/1995 | Gay et al. | 257/467 |
| 5,515,682 | 5/1996 | Nagakubo et al. | 62/3.7 |

(List continued on next page.)

FOREIGN PATENT DOCUMENTS

40763755 * 10/1995 (JP).

OTHER PUBLICATIONS

Shanes, H. R. et al., "*Thermal Conductivity of Silicon from 300 to 1400°K**", Physical Review (Jun. 1, 1963), Institute for Atomic Research and Department of Physics, Iowa State Univ., Ames, Iowa, pp. 1743–1748.

Louw, W. J., et al., "*Inductor–less, Capacitor–less State–Electrothermal Filters*", IEEE Journal Of Solid–State Circuits, vol. SC–12, No. 4, (Aug. 1977), pp. 002–010.

Heasel, E.L., "*The Heat–Flow Problem in Silicon: An Approach to an Analytical Solution with Application to the Calculation of Thermal Instability in Bipolar Devices*", IEEE Transactions On Electron Devices, vol. ED–25, No. 12, (Dec. 1978), pp. 1382–1388.

Richard J. Strnad, *Temperature Regulator Circuit and Precision Voltage Reference for Integrated Circuit*, Co–pending U.S. Application No. 09/216,032 filed Dec. 18, 1998.

Richard J. Strnad, *Temperature Control Struture for Integrated Circuit*, Co–pending U.S. Application No. 09/216,282, filed Dec. 18, 1998.

*Primary Examiner*—Olik Chaudhuri
*Assistant Examiner*—Hoai Pham
(74) *Attorney, Agent, or Firm*—Stallman & Pollock LLP

(57) ABSTRACT

A thermal coupler utilizes Peltier heating and cooling to transmit a thermal signal across an electrical isolation barrier. Application of a potential difference across a thermal emitter in the form of a first pair of parallel strips of electrically conducting materials separated by a second electrically conducting material results in a temperature difference arising at junctions between the first electrically conducting material and the second electrically conducting material. This temperature difference is propagated across the electrical isolation barrier to a similar thermal detector structure lacking an applied voltage and possessing a second pair of junctions. Differential heating of the second pair of junctions of the thermal detector creates a Seebeck voltage in the thermal detector. This Seebeck voltage is amplified and processed as a communication signal.

15 Claims, 3 Drawing Sheets

U.S. PATENT DOCUMENTS

| | | | |
|---|---|---|---|
| 5,689,958 | 11/1997 | Gaddis et al. | 62/3.7 |
| 5,697,082 | 12/1997 | Greer et al. | 455/255 |
| 5,706,302 | 1/1998 | Shimizu | 372/36 |
| 5,714,791 | 2/1998 | Chi et al. | 257/467 |
| 5,724,818 | 3/1998 | Iwata et al. | 62/3.7 |
| 6,107,645 * | 8/2000 | Hidaka | 257/84 |

* cited by examiner

THERMAL COUPLER UTILIZING PELTIER AND SEEBECK EFFECTS

BACKGROUND OF THE INVENTION

1. Field of the Invention

The present invention relates to a method for communicating across an electrical isolation barrier, and in particular, to a method and apparatus utilizing Peltier heating and the Seebeck Effect to permit communication of a thermal signal across an electrical isolation barrier.

2. Description of the Related Art

Electrical isolation boundaries are generally employed either to eliminate interference between electrical circuits, or to provide a current barrier for safety purposes. One example of an electrical isolation barrier is found in a power supply which runs off of a wall plug, but which has outputs electrically isolated from the wall plug itself. Another example of utilization of an electrical isolation barrier is found in the interface to a telephone system. Voice, data, and supervisory functions requiring a power supply to operate must be able to transmit signals between telephone lines and telephone or computing equipment while maintaining at least 1000 $V_{RMS}$ electrical isolation between the user and the power supply. This isolation ensures the safety of the user pursuant to FCC regulations.

A variety of methods have previously been employed to permit communication between systems separated by an electrical isolation barrier. All of these methods involve conversion of electricity to some other form of energy, which is transmitted across the boundary and then reconstituted in the form of an electrical signal.

Optoisolators convert an electrical signal into radiant energy, and then transmit the radiant energy across the electrical isolation barrier. Optoisolators consist of a light emitter and a light detector sealed together in a light-tight package. The intensity of the light emitted varies according to the amplitude of the electrical signal applied to the light emitter. The light detector receives the emitted light and in turn produces an electrical output having an amplitude corresponding to the intensity of the light received. The emitter and detector are manufactured as two separate elements, and are separated by an electrical isolation barrier in the form of a transparent or translucent electrically insulating material such as glass or plastic.

Another manner of communicating across an electrical isolation barrier is by the use of a transformer. Transformers convert an electrical signal into a magnetic field using a first electrically conducting coil. A second electrically conducting coil is then exposed to the magnetic field, either by virtue of physical proximity to the first coil or by directing the magnetic field using a magnetic material or "core." The second coil produces an electrical output in response to changing intensity of the magnetic field.

While optoisolators and transformers function adequately in many applications, these structures present a number of disadvantages. Most importantly, optoisolators and transformers cannot readily be integrated into an integrated circuit without utilizing expensive processing techniques. This is because complex and specialized structures are required to perform light emission and detection functions, or to generate and detect magnetic fields. As a result, optoisolators and transformers are generally only available in discrete form, and thus present economic and volumetric penalties to system designers.

Therefore, there is a need in the art for a device which enables systems to effectively communicate across an electrical isolation barrier but which avoids the complexity and cost of existing coupler technologies.

U.S. Pat. No. 4,757,528 to Falater et al. ("the Falater Patent") describes a coupler that utilizes transmission of a thermal signal in the form of Joule's heat across an electrical isolation barrier. Specifically, the Falater Patent describes the application of current to a resistor positioned on one side of the boundary. Passage of current through the resistor generates a thermal signal in the form of a temperature increase in the resistor and the surrounding material. This temperature increase may propagate across the electrical isolation barrier and be detected by changes in base-emitter voltage of a bipolar transistor positioned on the other side of the boundary.

The thermal coupler disclosed by the Falater Patent offers the advantage of utilizing components such as resistors and bipolar transistors that are readily incorporated in an integrated circuit. However, the Falater Patent suffers from a major disadvantage in that a thermal signal may be transmitted across the boundary only in the form of a temperature increase. Thus, the bandwidth of communication across the electrical isolation barrier is necessarily constrained by upper temperature limits inherent in the system. These temperature limits may be dictated by such factors as the composition of the resistor, the composition of the electrical isolation barrier, the intended use of the device, and the heat tolerance of other semiconducting structures present in the device.

Moreover, the effective bandwidth available to the device described in the Falater Patent would be expected to shrink over time. This is because repeated transmission of signals across the boundary would cause the resistor and the surrounding material to heat up, thereby narrowing the range of temperature changes detectable over an increasingly hot background.

Therefore, there is a need in the art for a device that enables a thermal signal to be effectively communicated across an electrical isolation barrier without the limitations in bandwidth present in existing designs.

SUMMARY OF THE INVENTION

The present invention relates to a thermal coupling device that utilizes Peltier heating and cooling to transmit a thermal signal across an electrical isolation barrier. The thermal coupler includes a thermal emitter and a thermal detector, both in the form of a first electrically conducting material separated by a second electrically conducting material. Application of a voltage from a power supply across the first electrically conducting material of the thermal emitter results in Peltier heating at junctions between the first and second electrically conducting materials. This temperature difference is transmitted across the electrical isolation barrier to a thermal detector positioned on the other side. The thermal detector has a structure similar to that of the thermal emitter. However, the thermal detector does not bear an applied voltage. Differential heating of junctions between the first and second conducting materials of the thermal detector, due to their proximity to the junctions of the thermal emitter, give rise to a Seebeck voltage. This Seebeck voltage can be amplified and detected. In this manner, Peltier heating and the Seebeck Effect are utilized to communicate a thermal signal across an electrical isolation barrier.

A thermal coupler in accordance with one embodiment of the present invention comprises a thermal emitter positioned on one side of the electrical isolation barrier, the thermal emitter including a first electrically conducting material coupled to a second electrically conducting material. The thermal emitter experiences a voltage difference applied from a power supply, and generates a thermal signal by Peltier heating. This thermal signal propagates across the electrical isolation barrier to an opposite side. The thermal coupler further comprises a thermal detector positioned on the opposite side of the electrical isolation barrier and includes a third electrically conducting material coupled to a fourth electrically conducting material. The thermal detector receives the thermal signal and in response generates a Seebeck voltage signal.

A method of communicating a thermal signal across an electrical isolation barrier in accordance with the present invention comprises the steps of providing a first junction between a first set of dissimilar electrically conducting materials positioned on one side of the electrical isolation barrier. A second junction is provided between the first set of dissimilar electrically conducting materials. A third junction is provided between a second set of dissimilar electrically conducting materials positioned on an opposite side of the electrical isolation barrier, the third junction proximate to the first junction. A fourth junction is provided between the second set of dissimilar electrically conducting materials, the fourth junction proximate to the second junction. A potential difference is applied across the first set of dissimilar electrically conducting materials to cause Peltier heating of the first junction and Peltier cooling of the second junction. A Seebeck voltage generated between the third junction and the fourth junction due to a temperature difference attributable to Peltier heating of the first junction and Peltier cooling of the second junction is then detected.

The features and advantages of the present invention will be understood upon consideration of the following detailed description of the invention and the accompanying drawings.

DETAILED DESCRIPTION

Figure 1:
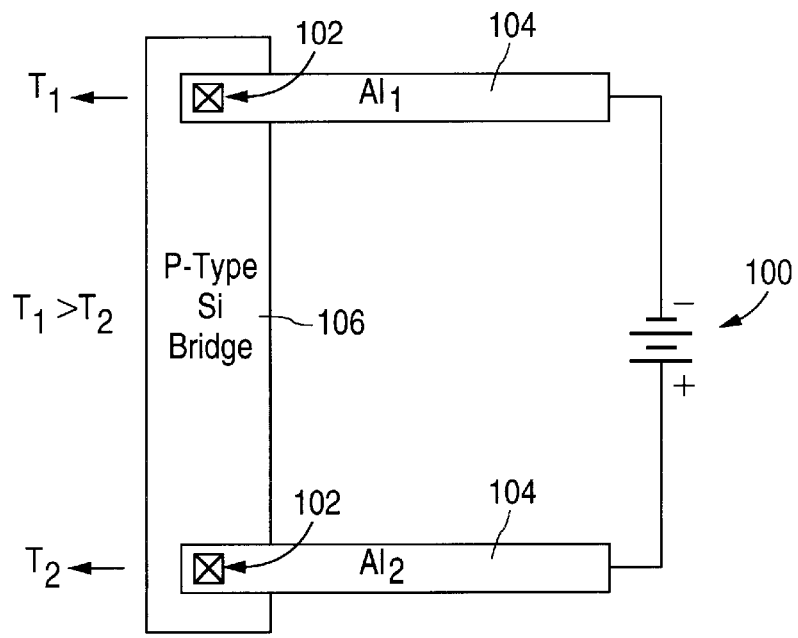
FIG. 1 shows a schematic depiction of the Peltier Effect.

FIG. 1 shows a schematic depiction of the Peltier Effect. According to the Peltier Effect, current from power supply 100 passed through junctions 102 of dissimilar conductors 104 and 106 (here aluminum and P-type silicon, respectively) results in absorption of heat at one junction and the emission of heat at the other junction. Due to frequent application of voltages to operate silicon-type semiconductor devices having metal contacts, the Peltier Effect is perhaps the dominant thermal phenomenon experienced by integrated circuits.

In considering FIG. 1, it is important to note that the relative temperatures of $T_1$ and $T_2$ are directly related to the polarity of the voltage drop applied across the aluminum contacts. Therefore, reversing the polarity of the voltage source 100 would make $T_1$ less than $T_2$.

It is further important to note that changing the conductivity type of the silicon bridge in FIG. 1 will also have the effect of reversing the relationship between $T_1$ and $T_2$. Thus, where the Si bridge is N-type rather than P-type as shown, $T_1$ would also be less than $T_2$.

Figure 2:
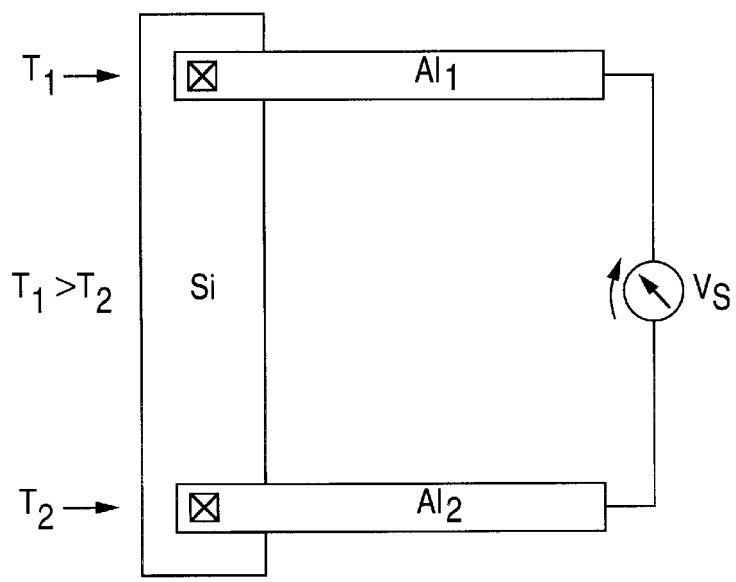
FIG. 2 shows a schematic depiction of the Seebeck Effect.

FIG. 2 shows a schematic depiction of the Seebeck Effect. The Seebeck Effect is simply the converse of the Peltier Effect. According to the Seebeck Effect, a Seebeck voltage ($V_s$) will be generated on contacts of a first electrically conducting material (here aluminum contacts $Al_1$ and $Al_2$, respectively) when these contacts are connected to a bridge formed from conductor of a second material (here, silicon), and when the contacts of the first electrically conducting material are maintained at different temperatures $T_1$ and $T_2$ respectively. The Seebeck voltage $V_s$ generated is proportional to the temperature difference ($T_1-T_2$), with $$V_s = \alpha(T_1 - T_2)$$

where $\alpha$ is the Seebeck coefficient. Room temperature values of $\alpha$ are typically in the range of $-10.0$ to $+10.0\ \mu V/^\circ C$. With Al/Si junctions, values of $\alpha$ may be as large as 1.4 mV/$^\circ$ C., which is the same order of magnitude as the temperature coefficient of the base-emitter voltage ($V_{be}$) of a bipolar transistor.

The Peltier and Seebeck Effects are related directly by:

$$(V_{SA} - V_{SB})_{T_1 T_2} = \int_{T_1}^{T_2} \frac{\Pi_{ab}}{T} dT$$

Since $\Pi_{ab}$ (Peltier) is defined per unit current flow, the power output (V*I) from a Seebeck junction pair with a small temperature difference $\Delta T$ is related to the Peltier heat transfer by a factor of the form $\Delta T/T$.

The Peltier/Seebeck Effect can be used to communicate a signal across an electrical isolation barrier. By utilizing a thermal coupler in accordance with the present invention, circuits operating at distinct DC voltages may effectively communicate with one another.

Figure 3:
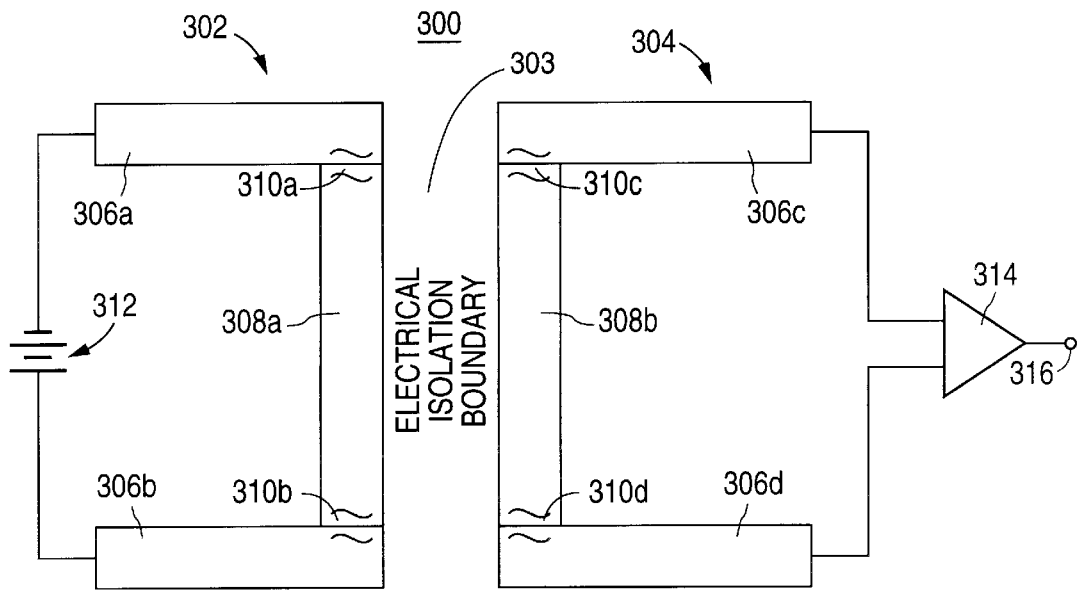
FIG. 3 shows a top view of one embodiment of a thermal coupler in accordance with the present invention.

FIG. 3 shows a top view of one embodiment of a thermal coupler in accordance with the present invention. Thermal coupler 300 includes two components: thermal emitter 302 and thermal detector 304. Thermal emitter 302 and thermal detector 304 are separated by electrical isolation barrier 303.

Both thermal emitter 302 and thermal detector 304 are in the form of a pair of strips formed from a first electrically conducting material, such as aluminum. These strips are connected across a bridge formed from a second electrically conducting material, such as P-type silicon.

Thermal emitter 302 thus includes strips 306a and 306b separated by bridge 308a, and includes junctions 310a and 310b between the first and second electrically conducting materials. Thermal detector 304 includes strips 306c and 306d separated by bridge 308b, and includes junctions 310c and 310d between the first and second electrically conducting materials.

Strips 306a and 306b of thermal emitter 302 are connected to power supply 312. Strips 306c and 306d of thermal detector 304 are connected to amplifier 314 having an output node 316.

Figure 4:
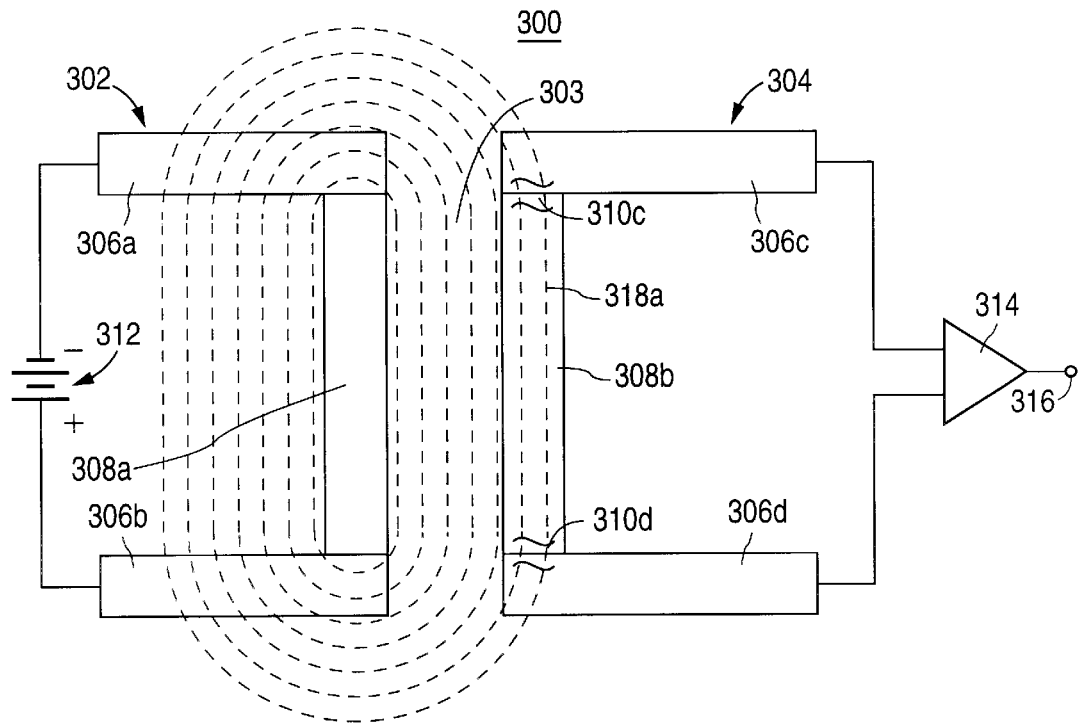
FIG. 4 shows a top view of the thermal coupler of FIG. 3 considering only the application of Joule's heat.

FIG. 4 shows a top view of the thermal coupler 300 of FIG. 3, considering only the effect of Joule's heat. Joule's heat is generated by the passage of electrical current from power supply 312 through first conducting bridge 308a of thermal emitter 302. Passage of current through first electrically conducting bridge 308a generates a Joule's heat generally uniform along the length of bridge 308a. The isotherms 318a of Joule's heat propagated across electrical isolation barrier 303 are symmetrical with respect to junctions 310c and 310d of thermal detector 304. Junctions 310c and 310d would therefore be heated simultaneously by the Joule's heat, with no net Seebeck voltage output generated. Thus, if only Joule's heat is considered thermal coupler 300 would not function to communicate a signal across the electrical isolation barrier.

Figure 5:
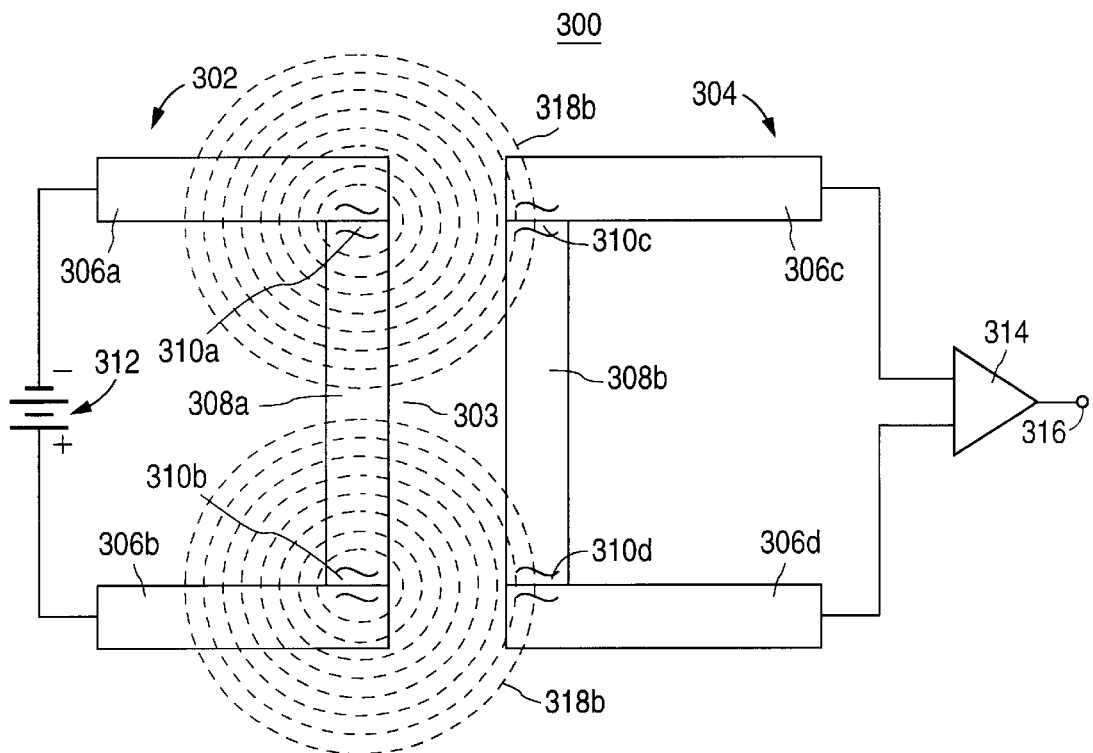
FIG. 5 shows a top view of the thermal coupler of FIG. 3 considering only the application of Peltier heat.

FIG. 5 shows a top view of thermal coupler 300 considering only the application of Peltier heat. Application of a potential difference from power supply 312 across bridge 308a causes Peltier cooling at junction 310a and Peltier heating at junction 310b of thermal emitter 302. Isotherms 318b representing the propagation of this Peltier heat across the electrical isolation barrier 303 are asymmetrical with respect to junctions 310c and 310d of thermal detector 304. Junction 310c would experience a temperature decrease, while junction 310d would experience a temperature increase. And as described above in connection with FIG. 2, this asymmetrical heating of junctions 310c and 310d would generate a Seebeck voltage signal fed to amplifier 314.

Figure 6:
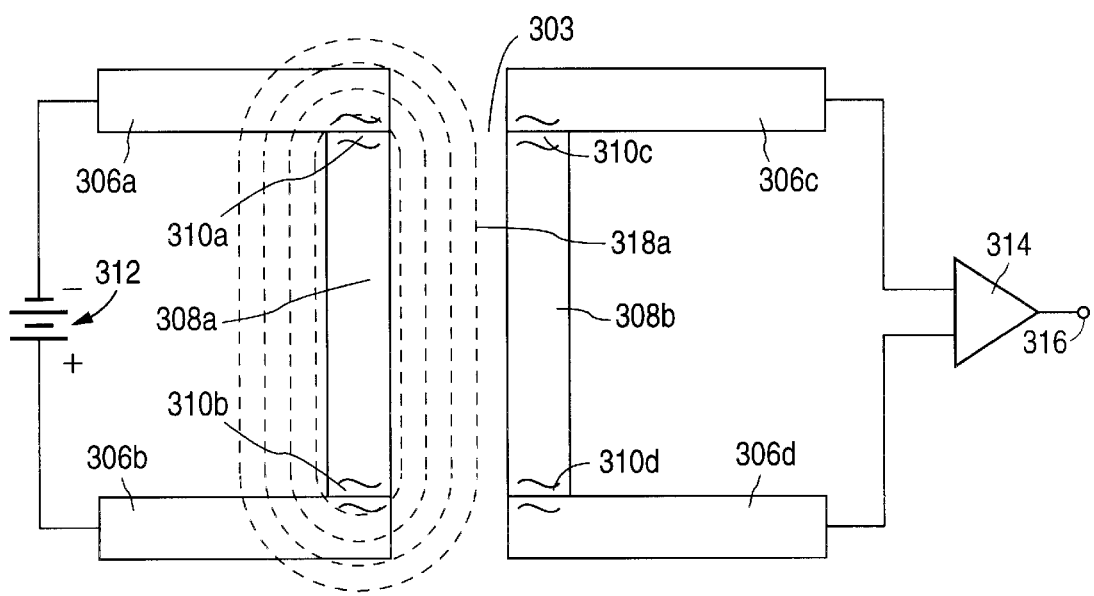
FIG. 6 shows a top view of the thermal coupler of FIG. 3 considering both the application of Joule's heat and Peltier heat.

In reality, both Joule's heat and Peltier heat are produced from application of voltage and current across bridge 308a of thermal emitter 302. FIG. 6 therefore shows a top view of thermal coupler 300 considering application of both Joule's heat and Peltier heat.

Where the effects of Peltier and the Joule's heat are combined, a net temperature increase would likely result. Isotherms 318c propagated across electrical isolation barrier 303 would reflect combined Joule and Peltier heating, and would thus assume a pear-like shape. Junctions 310c and 310d of thermal detector 304 would continue to experience a temperature difference, albeit one moderated by the overall Joule's heating. The temperature difference experienced between junctions 310c and 310d would again give rise to a net Seebeck voltage to be amplified by amplifier 314 and processed. Depending on the magnitude of the applied voltage and type of electrically conducting materials employed to form thermal coupler 360, the Seebeck voltage generated could be as high as 2 mV/° C, with Peltier temperature differentials between the junctions as high as +20° C.

The operating speed of thermal coupler 300 would be determined by the speed of propagation of the Peltier heat signal across electrical isolation barrier 303. The Drude model of electrical conduction assumes that the bulk of the thermal current is carried by the conduction electrons, which are distributed primarily at the surface of a material. The movement of the surface electrons and the shallow observed penetration of a propagating electromagnetic waves in a material is known as the "skin effect".

Thermal conductivity and the electrical conductivity are related by the empirical constant created by Wiedemann and Frantz and explained by Drude in his model. The Wiedemann-Frantz law states that the ratio of the thermal to the electrical conductivity is proportional to the temperature, with a proportionality constant. Therefore, by analogy to the skin effect observed as an electromagnetic wave moves through a medium, the thermal signal of the present invention should travel on the surface of the semiconducting material, penetrating only to a shallow depth. As a result, the thermal signals should be able to be communicated between the thermal emitter and thermal detector with frequencies in the Mhz range.

The present invention offers several important advantages over existing optical and magnetic coupler designs. For example, until now it was generally not possible to readily integrate an optical or magnetic coupling system on a single die. Often, external components such as light emitters, light detectors, and electrical coils were required to be added to the chip at considerable expense.

However, with the present invention all of the functional blocks of the circuit are available to the designer as standard components of integrated circuits. The thermal emitter and detector structures of the thermal coupler may readily be fabricated in a semiconductor material in which an IC is formed. For example, electrically bridges may be formed by introducing conductivity-altering P- or N-type dopant into silicon. This may be accomplished in a variety of ways, including ion-implantation, or chemical vapor deposition followed by thermal diffusion.

Moreover, the conducting strips may be composed of a metal such as aluminum. These conducting strips could therefore be fabricated employing conventional metallization process flows, as are commonly employed to create interconnects of the integrated circuit. Furthermore, the amplifier component of the thermal coupler could readily be manufactured and incorporated into an integrated circuit using known techniques.

The present invention also offers several important advantages over the thermal coupler design of the Falater Patent discussed above. Specifically, the Falater Patent transmits a thermal signal across the electrical isolation barrier in the form of Joule's heat. This communication is thus limited to heating of the material making up the thermal isolation boundary.

By contrast, the thermal signal transmitted across the electrical isolation barrier in accordance with the present invention is generated by Peltier heating at one junction combined with simultaneous Peltier cooling at the other junction. As a result of this heating and cooling, the available range of temperature differentials is much broader than that found in a device utilizing only Joule's heating. This is true even though an overall positive temperature change would be experienced by the present invention when the associated Joule's heat is taken into account.

In addition, as discussed above in connection with FIG. 1, reversing the polarity of the voltage applied by the power supply 312 of the thermal emitter 302 will have the effect of reversing the thermoelectric effect observed at junctions 310a and 310b. In FIG. 5, junction 310a formerly cooled would be heated, and junction 310b formerly heated would be cooled. In this manner, alternating polarity of the voltage applied to thermal emitter 302 can assist in maintaining a relatively constant temperature of the surrounding material. As only a small amount of net heating would occur over time, only a slight corresponding narrowing of thermal bandwidth would be observed.

Although the invention has been described above in connection with one specific preferred embodiment, it should be understood that the invention as claimed should not be unduly limited to such specific embodiments. Various other modifications and alterations in the structure and method of operation of this invention will be apparent to those skilled in the art without departing from the scope of the present invention.

For example, a variety of combinations of electrically conducting materials could be employed to create the thermal emitter and thermal detector in accordance with the present invention. Silicides, polysilicon, single crystal silicon containing conductivity-altering N- or P-type dopant, or metals such as aluminum or copper could be utilized to form the electrically conducting materials forming the thermal coupler in accordance with the present invention.

Moreover, while the first embodiment depicts the thermal emitter and thermal detector as substantially identical in both composition and shape, this is not required by the present invention. Either structure could be specially designed to best perform its designated function of emitting or receiving the thermal signal across the electrical isolation barrier.

Therefore, it is intended that the following claims define the scope of the present invention, and that the methods and structures within the scope of these claims and their equivalents be covered hereby.

What is claimed is:

1. An apparatus enabling communication across an electrical isolation barrier, the apparatus comprising:

a thermal emitter positioned on one side of the electrical isolation barrier, the thermal emitter including a first electrically conducting material coupled to a second electrically conducting material, the thermal emitter experiencing a voltage difference applied from a power supply and generating a thermal signal by Peltier heating, the thermal signal propagating across the electrical isolation barrier to an opposite side; and a thermal detector positioned on the opposite side and including a third electrically conducting material coupled to a fourth electrically conducting material, the thermal detector receiving the thermal signal and in response generating a Seebeck voltage signal.

2. The apparatus according to claim 1 wherein:

the thermal emitter comprises a first region of the second electrically conducting material coupled at a first junction between a first region of the first electrically conducting material and coupled at a second junction between a second region of the first electrically conducting material, the first and the second junction experiencing a temperature difference in response to the applied voltage difference; and wherein the thermal detector comprises a second region of the second electrically conducting material coupled at a third junction between a third region of the first electrically conducting material and coupled at a fourth junction between a fourth region of the first electrically conducting material, the third and the fourth junction experiencing the temperature difference and in response generating the Seebeck voltage signal.

3. The apparatus according to claim 2 wherein:

the first and the second regions of the first electrically conducting material are parallel strips, and the first region of the second conductivity type is a bridge perpendicular to the first and second regions of the first electrically conducting material; and the third and fourth regions of the third electrically conducting material are parallel strips, and the second region of the fourth electrically conducting material is a bridge perpendicular to the third and fourth regions of the first electrically conducting material.

4. The apparatus according to claim 3 wherein:

the first electrically conducting material is selected from the group consisting of metal, silicide, polysilicon, N-type doped single-crystal silicon, or P-type doped single crystal silicon.

5. The apparatus according to claim 4 wherein:

the second electrically conducting material is selected from the group consisting of metal, silicide, polysilicon, N-type doped single crystal silicon, or P-type doped single-crystal silicon, and wherein the second electrically conducting material is different from the first electrically conducting material.

6. The apparatus according to claim 5 wherein the first electrically conducting material is aluminum and the second electrically conducting material is one of N-type doped single-crystal silicon and P-type doped single-crystal silicon.

7. The apparatus according to claim 3 wherein:

the third electrically conducting material is selected from the group consisting of metal, silicide, polysilicon, N-type doped single-crystal silicon, or P-type doped single crystal silicon.

8. The apparatus according to claim 7 wherein:

the fourth electrically conducting material is selected from the group consisting of metal, silicide, polysilicon, N-type doped single crystal silicon, or P-type doped single-crystal silicon, and wherein the fourth electrically conducting material is different from the third electrically conducting material.

9. The apparatus according to claim 8 wherein the third electrically conducting material is aluminum and the fourth electrically conducting material is one of N-type doped single-crystal silicon and P-type doped single-crystal silicon.

10. An apparatus enabling communication across an electrical isolation barrier, the apparatus comprising:

means for Peltier heating of a first junction located between a first electrically conducting material and a second electrically conducting material, the first junction positioned on one side of an electrical isolation barrier;

means for Peltier cooling of a second junction located between the first electrically conducting material and the second electrically conducting material, the second junction positioned on the one side of the electrical isolation barrier; and means for generating a Seebeck voltage at a third junction and a fourth junction between a third electrically conducting material and a fourth electrically conducting material, the third and fourth junctions positioned on an opposite side of the electrical isolation barrier, the third junction proximate to the first junction and the fourth junction proximate to the second junction.

11. The apparatus according to claim 10 further comprising means for amplifying the Seebeck voltage.

12. The apparatus according to claim 10 wherein the Peltier heating means and the Peltier cooling means comprises:

a first bridge of the first electrically conducting material positioned between a first and a second strip of the second electrically conducting material to form the first junction between the first strip and a first end of the first bridge, and the second junction between a second end of the first bridge and the second strip, and a power supply in electrical communication with the first and second strip; and wherein the means for generating a Seebeck voltage comprises, a second bridge of the third electrically conducting material positioned between a third and a fourth strip of the fourth electrically conducting material to form the third junction between the third strip and a first end of the second bridge, and the fourth junction between a second end of the second bridge and the fourth strip.

13. The apparatus according to claim 12 wherein the first and fourth electrically conducting materials are each selected from the group consisting of metal, silicide, polysilicon, N-type doped single-crystal silicon, or P-type doped single crystal silicon.

14. The apparatus according to claim 13 wherein the second and third electrically conducting materials are each selected from the group consisting of metal, silicide, polysilicon, N-type doped single crystal silicon, or P-type doped single-crystal silicon, and wherein the second electrically conducting material is different from the first electrically conducting material and the fourth electrically conducting material is different from the third electrically conducting material.

15. The apparatus according to claim 14 wherein the first and fourth electrically conducting materials are the same, and the second and third electrically conducting materials are the same.

* * * * *